United States Patent
Zorrilla et al.

(10) Patent No.: US 7,966,594 B2
(45) Date of Patent: Jun. 21, 2011

(54) AUTOMATED METHOD FOR THE HIERARCHICAL AND SELECTIVE INSERTION OF DUMMY SURFACES INTO THE PHYSICAL DESIGN OF A MULTILAYER INTEGRATED CIRCUIT

(75) Inventors: Marta Zorrilla, Fontenay le Fleury (FR); Vivian Blanchard, Saint Germain En Laye (FR)

(73) Assignee: Bull S.A., Les Clayes Sous Bois (FR)

( * ) Notice: Subject to any disclaimer, the term of this patent is extended or adjusted under 35 U.S.C. 154(b) by 587 days.

(21) Appl. No.: 12/007,678

(22) Filed: Jan. 14, 2008

(65) Prior Publication Data

US 2008/0127025 A1     May 29, 2008

Related U.S. Application Data

(62) Division of application No. 11/065,280, filed on Feb. 25, 2005, now Pat. No. 7,343,580.

(30) Foreign Application Priority Data

Feb. 27, 2004   (FR) ...................................... 04 02011

(51) Int. Cl.
    *G06F 17/50*          (2006.01)
(52) U.S. Cl. ......... 716/110; 716/118; 716/119; 716/132

(58) Field of Classification Search .......... 716/100–101, 716/106, 110, 126, 132, 54, 111, 118–119
See application file for complete search history.

(56) References Cited

U.S. PATENT DOCUMENTS

| 2003/0229868 A1 | 12/2003 | White et al. |
| 2005/0076316 A1* | 4/2005 | Pierrat et al. ...................... 716/4 |
| 2006/0168551 A1 | 7/2006 | Mukuno |

* cited by examiner

*Primary Examiner* — Paul Dinh
(74) *Attorney, Agent, or Firm* — Miles & Stockbridge P.C.

(57) ABSTRACT

The invention relates to an automated method for inserting dummy surfaces (95) into the various layers of the physical design (121) of multilayer integrated circuits organized in interconnected units (2) containing interconnected blocks (30) composed of interconnected cells (3), implemented by an integrated circuit design system (100). The multilayer integrated circuit design (121), stored in the design system (100) is implemented layer by layer, through selective insertion of patterns of dummy surfaces (95), the selective insertion is based on an insertion hierarchy that respects the hierarchy of the physical design (121) of the integrated circuits, by means of individual implementation of the interconnected blocks (30) and first interconnection routing (31) for said interconnected blocks (30) and individual implementation of the interconnected units (2) and second interconnection routing (22) for said interconnected units (2). The patterns of dummy surfaces are established selectively in accordance with the design of the blocks (30) of the integrated circuit.

8 Claims, 3 Drawing Sheets

AUTOMATED METHOD FOR THE HIERARCHICAL AND SELECTIVE INSERTION OF DUMMY SURFACES INTO THE PHYSICAL DESIGN OF A MULTILAYER INTEGRATED CIRCUIT

CROSS REFERENCE TO RELATED APPLICATION

This application is a divisional of application Ser. No. 11/065,280 filed Feb. 25, 2005 now U.S. Pat. No. 7,343,580.

The present invention concerns the field of semiconductors, and in particular multilayer integrated circuits of the VLSI (Very Large Scale Integration) or ASIC (Application-Specific Integrated Circuit) types. This invention also applies to the field of computer-aided design (CAD), and in particular the automated design of integrated circuit surfaces. The present invention concerns a method that allows dummy surfaces to be automatically inserted into the various layers of multilayer integrated circuits, so as to comply with the surface density rules imposed by semiconductor manufacturers.

Semiconductor methods for manufacturing integrated circuits require that the surface density of each layer be within a given range and that its distribution be as homogeneous as possible in each of the constituent layers of the multilayer integrated circuit. The conventional method for manufacturing integrated circuits relies on the superposition of successive layers through successive maskings of silicon slices, and on photo etching, scattering, metallizing, polishing, and doping operations, etc. The superposition of the various layers of the integrated circuit makes it possible to implement elementary logic functions. The physical design of the elements constituting an integrated circuit introduces surface variations throughout the circuit. The introduction of so-called dummy surfaces between the constituent elements of the physical design of the integrated circuit is therefore necessary in order to homogenize the surface density of a given layer of the integrated circuit and allow the layer above it to be produced. These surfaces are called "dummy" surfaces because they are not involved in any of the elements of the integrated circuit. They are also known as "filler" structures. In order to allow designers to comply with the surface density rules imposed, the manufacturer generally defines the shape and maximum sizes of the dummy surfaces that must be inserted, as well as the maximum spacing between dummy surfaces and the exclusion areas of the dummy surfaces, which correspond to the space around the elements of the physical design in which no surface should be present.

There are methods known in the prior art for inserting dummy surfaces, which implement the integrated circuit globally, defining a pattern and inserting it into the empty spaces of the integrated circuit. In general, squares or rectangles are inserted into the empty spaces with a spacing optimized so as to conform to the required surface density of the circuit. These methods make it possible to homogenize the surface density without requiring any change in the arrangement of the physical design of the circuit. However, this solution has several disadvantages. With this type of method, dummy surfaces are inserted even in regions where the density is already acceptable, and thus in certain regions the density can exceed the maximum density accepted by the manufacturer, making it necessary to modify the implementation performed. Sometimes the required minimum density cannot be achieved because the physical design is such that it is impossible to insert dummy surfaces. In this case, the design being completely finished, no local modification is possible and the entire design must be revised. Moreover, the performance of the circuit cannot be controlled with this type of method, and the deterioration in the performance of the integrated circuit produced by the dummy surfaces can be too great. Furthermore, the addition of a large number of elements generates design files for the integrated circuit that are too large. Lastly, these methods require too long a development time in order to find the pattern that will produce the best result. The last two drawbacks mentioned grow even more serious as the number of layers used and the size of the circuit increase.

Manufacturers generally supply a design rules control (DRC) tool that allows designers to verify whether their integrated circuits comply with the requisite design and density rules. This tool performs a surface density check on each of the layers of the integrated circuit, by means of a calculation of the surface density in density control windows whose shapes and dimensions are optimized by the manufacturers.

The design of complex integrated circuits with large numbers of transistors is implemented hierarchically. The circuit is divided into interconnected units, each unit being divided into blocks, also interconnected. The physical design of the blocks can be implemented according to two different methods. The first, known as the "standard cell" method, consists of assembling and interconnecting cells from a predefined cell library, in which each cell corresponds to a logic gate. The blocks thus created are composed of an array of several cells placed in rows and generally interconnected by channels located between the rows. The second, known as the custom cell method, consists of designing cells that are specially sized based on the electrical characteristics implemented. The interconnections of cells of this type are produced inside the cell itself. The blocks obtained by combining cells of this type are thus generally more complex, and therefore require a more complex operation for the insertion of dummy surfaces into the various layers of the circuit.

The interconnections between the blocks that form the units and the interconnections between the units that form the physical design of a circuit are implement by means of a specific automatic routing system. The various methods can use different design rules, but all of them must respect the limits imposed by the manufacturer. It would therefore be desirable to have a method that is selective as to the design method used, and that conforms to the manufacturers' rules. Moreover, the known methods of the prior art do not generally respect the hierarchy resulting from the physical design, and require an integral implementation of the design each time one of its blocks is modified. A method that is selective as to the manufacturing method and that respects the hierarchy of the design would make it possible to selectively implement only the modified block, applying only the method used for the design of the block in question, and would make it possible to reuse the various blocks or units, with their optimized dummy surfaces, in other integrated circuits.

Another problem in the design of integrated circuits, the magnitude of which increases as the critical dimensions decrease, is coupling between nearby metal links running through the layer or between those that pass over each other because they run through different metal levels. One way to improve the performance of the circuit is to define design rules for the metal links with spacings larger than the minimum allowed by the technology, which would reduce nearby coupling phenomena. The maximum filler density of the design under these conditions is less than or equal to the minimum density accepted by the manufacturer. But the addition of dummy surfaces will then be necessary, and they will contribute to the coupling with the metal links. The insertion of dummy surfaces around the metal routing links of the circuits is therefore an important stage for the performance of the integrated circuit.

There are known methods in the prior art for filling the empty spaces of an integrated circuit using a "reverse mask" method. The negatives of the masks used for the physical design are used to protect the constituent elements of the circuit and to expose the empty spaces, which are then filled homogeneously. This method entails an enormous additional cost and too great a risk of defects because of the coupling problems due to the proximity of the dummy surfaces and the constituent elements of the circuit.

All integrated circuit design methods must respect the surface density rules required by manufacturers and the various constraints imposed by coupling problems in the circuits. The number of added elements should be as low as possible, and the methods should avoid, insofar as possible, any coupling between the metal links and the added surfaces, while respecting the exclusion areas. Designers, in order to optimize the performance of their circuits, will also choose to avoid the superposition of dummy surfaces with metal links running through another level but with the same orientation. In this context, it is advantageous to define a mode for inserting dummy surfaces that can accommodate various design methods, their hierarchies, and the constraints imposed by manufacturers and designers. One way to facilitate the implementation would be to use the density control windows specified by the manufacturers. The surface density calculated would make it possible to selectively insert dummy surfaces into only the low-density areas. The dummy surfaces must be inserted so as to respect the exclusion areas and a maximum spacing between dummy surfaces.

The object of the present invention is to meet the demands of integrated circuit manufacturing methods and to overcome certain drawbacks of the prior art by offering an automated method for inserting dummy surfaces into the physical design of integrated circuits that is selective as to the method used for the physical design of the integrated circuit and that makes it possible both to respect the hierarchy of the physical design and to homogenize the surface density in each of the layers of the integrated circuit in accordance with the surface density rules imposed by manufacturers, while minimizing the coupling capacity between the added dummy surfaces and the elements of the physical design of the integrated circuit.

This object is achieved by means of an automated method for inserting dummy surfaces into the various layers of the physical design of multilayer integrated circuits organized in interconnected units containing interconnected blocks composed of interconnected cells, implemented by an integrated circuit design system, characterized in that it consists in an automated, layer by layer, implementation of a multilayer integrated circuit design, stored in storage means of the design system, through a selective insertion of patterns of dummy surfaces based on an insertion hierarchy that respects the hierarchy of the design of the integrated circuits, by means of an individual implementation of the blocks and their interconnection routing and an individual implementation of the units and their interconnection routing, the patterns being established selectively in accordance with the methods used for the design of the blocks of the integrated circuit.

According to another characteristic, the patterns of dummy surfaces established selectively in accordance with the methods used for the design of the blocks of the integrated circuit are determined via geometric computing means of the design system and via rules for defining patterns for dummy surfaces stored in the storage means of the design system, these patterns being defined by a shape, a size, an orientation and exclusion areas of the dummy surfaces, and by a spacing between dummy surfaces.

According to another characteristic, the selective insertion of patterns of dummy surfaces based on an insertion hierarchy that respects the hierarchy of the design of the integrated circuits is performed through the intervention of a user, called the designer, who defines, with the help of command entry means of the design system, the blocks and/or units to be implemented in the design of the circuit, as well as the method used for the design of the blocks.

According to another characteristic, the selective insertion of patterns of dummy surfaces based on an insertion hierarchy that respects the hierarchy of the design of the integrated circuits is implemented in an automated way via means for recognizing the hierarchy of the design and means for recognizing the design methods, implemented in the design system and allowing an automatic definition of the blocks and/or units to be implemented in the design of the circuit, and of the method used for their design, instead of requiring the intervention of the user.

According to another characteristic, the method includes a step for determining low surface density areas into which dummy surfaces should be inserted, performed by means of a calculation of the surface density in each of the layers of the circuit, in density control windows whose shape and dimensions are established based on the density control windows defined by the semiconductor manufacturers and stored in storage means of the integrated circuit design system, this calculation being performed by density calculating means implemented in the integrated circuit design system and making it possible to implement only the windows whose densities do not correspond to the density required by the manufacturers and to minimize the number of elements added to the circuit.

According to another characteristic, the hierarchy for the insertion of the dummy surfaces, the determination of the low surface density areas into which dummy surfaces should be inserted and the rules for defining patterns for dummy surfaces result in an implementation of the physical design of the integrated circuit in accordance with the following steps:

insertion of dummy surfaces into the low surface density areas of each of the blocks of the design, independently from one another, in accordance with the method used for their design and their specific routing;

implementation of the routing between the blocks and combination with the results obtained for each block, in order to obtain a homogeneous unit that corresponds to the design of a unit with its dummy surfaces inserted;

possible removal of the dummy surfaces located on the edge of a block that do not respect the exclusion areas, through the use of exclusion area verification means;

combination of the results obtained for each of the units with one another, followed by a decision, based on the size and the complexity of the circuit, on the implementation step to be performed on the routing between the units, between either a step for inserting dummy surfaces into the low surface density areas in the combination of homogeneous units, or a step for inserting dummy surfaces into the routing areas between the combined homogeneous units, with the help of a prior step for masking the areas defined by the designer.

combination of the result from the combined homogenous units with the result of the implementation of the routing between the units, possibly followed by a removal of dummy surfaces located on the edge of a unit that do not respect the exclusion areas, through the use of exclusion area verification means, in order to obtain a pattern of dummy surfaces for the entire integrated circuit.

According to another characteristic, the hierarchy for the insertion of the dummy surfaces requires that the low surface density areas implemented first correspond to the windows whose density is zero, the rules for defining patterns for dummy surfaces requiring, in these zero-density windows, the insertion of dummy surfaces with the same orientation as the routing of the layer being implemented, with a maximum dimension corresponding to the dimensions of the density control window, a minimum dimension corresponding to the minimum dimension defined by the manufacturers, and a spacing between the surfaces defined so as to obtain a density slightly higher than the minimum required by the manufacturers.

According to another characteristic, the hierarchy for the insertion of the dummy surfaces requires that the low surface density areas implemented second correspond to the windows whose density is even lower than the minimum required by the manufacturers, the rules for defining patterns for dummy surfaces requiring, in these windows of insufficient density, the insertion of dummy surfaces similar to the metal links of the routing, with a large exclusion area, while prohibiting the superposition of the dummy surfaces with metal links running in the same orientation in another layer.

According to another characteristic, the rules for defining patterns for dummy surfaces include a priority order in the choice of constraints to be imposed on these patterns from among the constraints on the shape, size, orientation and exclusion areas of the dummy surfaces to be inserted, this priority order being stored in the storage means of the integrated circuit design system and making it possible to authorize, if necessary, the lifting of the constraints, one by one, in accordance with the following steps, the iterations of which make it possible to define the patterns of the dummy surfaces to be inserted:
  authorization of the superposition of dummy surfaces with metal links running in the same orientation in another layer;
  authorization of the insertion of dummy surfaces with an orientation perpendicular to the orientation of the layer into which they are inserted;
  authorization of the reduction of the exclusion areas of the dummy surfaces inserted in the same orientation as the layer;
  authorization of the reduction of the exclusion areas of the dummy surfaces inserted in an orientation perpendicular to that of the layer into which they are inserted.

According to another characteristic, the selective insertion of patterns of dummy surfaces in accordance with the method used to design the blocks and the rules for defining patterns for dummy surfaces make it possible, for the regions designed with standard cells, to define dummy surfaces of small size, placed closer to one another and having limited exclusion areas, and to authorize the superposition of dummy surfaces with metal links running in the same orientation in another layer, the implementation of the regions designed with custom cells requiring full compliance with the priority order in the choice of constraints to be imposed, with an extensive iteration of the steps defining the priority order of the constraints, resulting in a wide variety of patterns for dummy surfaces.

According to another characteristic, the method according to the invention makes it possible to implement non-hierarchical physical designs, via the determination of the windows to be implemented first based on their density, via the rules for defining the patterns of the dummy surfaces to be inserted, and possibly via the step for masking areas defined by the designer.

According to another characteristic, the method is implemented through the execution, by the integrated circuit design system, of a computer-aided design software tool which executes macros that allow the iterations of the various steps of the method, resulting in the selective definition of the patterns of the dummy surfaces and their insertion into the successive layers of the integrated circuit.

According to another characteristic, the exclusion areas of the dummy surfaces used during the implementation of the method have dimensions larger than those defined by the manufacturers, so that when the size constraints of the exclusion areas are all lifted, the exclusion areas obtained retain a size greater than or equal to the size of the exclusion areas defined by the manufacturers.

According to another characteristic, the method can be limited by the user so as to implement only certain blocks or certain units, in order to allow the parallel implementation of different portions of the circuit in several integrated circuit design systems so as to accelerate the implementation of the complete design of the circuit, the separate implementation of the blocks and/or units allowing a subsequent selective modification of these elements of the circuit individually, and their potential reuse in case of the presence of an identical element in another region of the circuit or in another integrated circuit.

Another object of the invention is to meet the demands of integrated circuit manufacturing methods and to overcome certain drawbacks of the prior art by offering an integrated circuit design system that makes it possible to implement the method according to the invention by inserting dummy surfaces into the physical design of integrated circuits so as to homogenize the surface density in each of the layers of the integrated circuit in accordance with the surface density rules imposed by manufacturers, respecting both the hierarchy of the physical design and the method used for the physical design of the integrated circuit, while minimizing the coupling capacity between the added dummy surfaces and the elements of the physical design of the integrated circuit.

This object is achieved by means of an integrated circuit design system that makes it possible to implement the method according to the invention through the execution of macros in computer-aided design software tools comprising display means and means for command entry by the user, characterized in that it includes storage means, calculating means, processing means and exclusion area verification means.

According to another characteristic, the calculating means also include density calculating means and geometric computing means.

According to another characteristic, the storage means also contain information concerning the physical design of the integrated circuit into which the dummy surfaces must be inserted, the shape and dimensions of the density control windows defined by the semiconductor manufacturers, the rules for defining patterns for dummy surfaces which make it possible to define patterns for the dummy surfaces based on the surface densities of the various windows, the various methods for designing the blocks, and the priority order defined by the manufacturer of the integrated circuit for the choice of constraints to be imposed on the patterns of the dummy surfaces to be inserted, all of this information being accessible to the processing means of the integrated circuit design system so that it can be taken into account during the execution of the macros that allow the definition of the patterns of the dummy surfaces and their insertion into the successive layers of the integrated circuit.

According to another characteristic, the design system also includes means for recognizing the hierarchy of the design and means for recognizing the design methods, so that the definition of the blocks and/or units to be implemented in the design of the circuit, and of the method used for their design, are implemented in an automated way by the system without requiring the intervention of the user.

Other characteristics and advantages of the present invention will emerge more clearly through the reading of the description below, given in reference to the attached drawings, in which.

Figure 1:
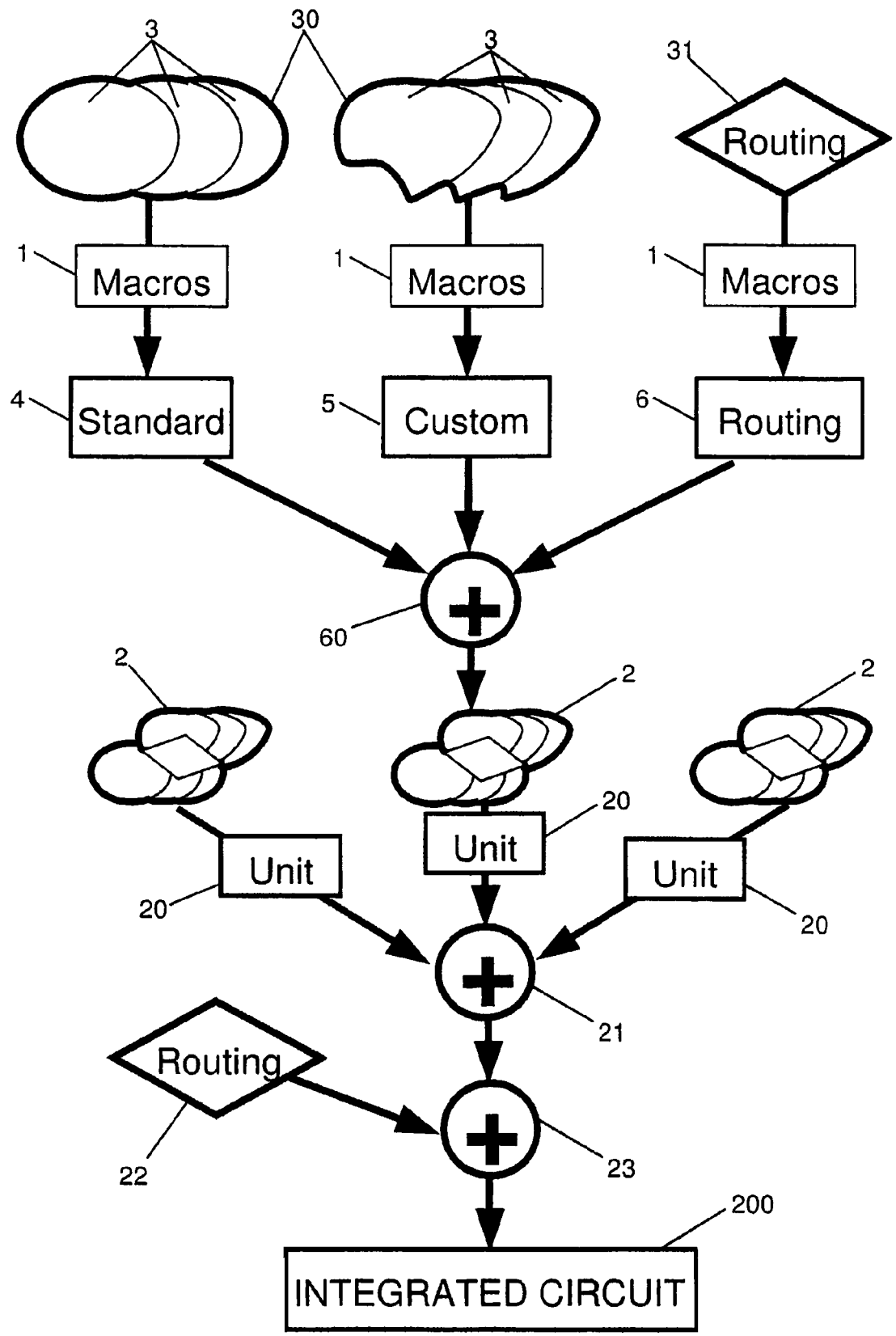
FIG. 1 represents a diagram of the steps of the implementation performed by the method implemented by the invention, in keeping with the known design methods of the prior art.

The present invention concerns a method that allows dummy surfaces (95) to be inserted into the physical design (121) of integrated circuits, in such a way as to respect the surface density rules imposed by semiconductor manufacturers. This method uses a computer-aided design (CAD) tool that makes it possible to define the dimensions and relative and respective positions of various polygons and to calculate the surface density in a given window of the design. No details on such design tools will be provided since they do not characterize the invention, but rather constitute an environment in which the invention can be implemented. The invention is defined by the use of macros (1) that make it possible to implement the various steps of the method and that are executed in the software environment provided by the CAD tools.

The designer of the integrated circuit uses an integrated circuit design system (100) according to the invention, in which runs, for example, a CAD software tool which executes the macros (1) that make it possible to implement the method according to the invention. Display means (110) and command entry means (111) of the design system (100) allow the user, called the designer, to define certain parameters that control the automated execution of the steps of the method according to the invention. The designer can thus define the surface density rules imposed by the manufacturers of semiconductor integrated circuits, such as the required minimum density. Manufacturers require that the surface density be homogeneous across the entire surface of the various layers of an integrated circuit and generally verify this surface density using a design rules control (DRC) tool. Using the command entry means (111), the designer can also define the size and shape of the density control windows he wishes to use and can initiate one or more of the steps of the method according to the invention. This method is automated, and the designer can parameterize his system so that it performs the insertion of the dummy surfaces (95) into the physical design (121) of the integrated circuit as a whole, without requiring the intervention of the designer, until the final result is obtained. The designer can also initiate the insertion of dummy surfaces (95) into only part of the design (121) of the integrated circuit, since the method used respects the hierarchy of the physical design (121), implementing each of its constituent elements individually.

In a variant of embodiment, the full implementation of the circuit is performed through the intervention of the user of the design system (100), who defines the various blocks (30) and/or units (2) to be implemented in the design (121) of the integrated circuit, as well as the methods used for the design of the blocks (30). Based on this hierarchy of the design (121) defined by the user, the method will perform the implementation of the various successive blocks (30) and/or units (2) of the circuit, by inserting dummy surfaces (95) into the various layers of the circuit. Depending on the blocks and/or units to be implemented, the routing between the blocks and/or between the units will also be implemented, the insertion of dummy surfaces into the routing inside the blocks being performed during the implementation of the blocks. In another variant of embodiment, the design system (100) also includes means (141) for recognizing the hierarchy present in the design (121) of the integrated circuits and means (142) for recognizing the design methods used. The method implemented by this system therefore makes it possible to insert dummy surfaces into all the layers of the circuit, without requiring the intervention of the user to define the method used for the design of the blocks (30) contained in the units (2) of the circuit.

Figure 3A:
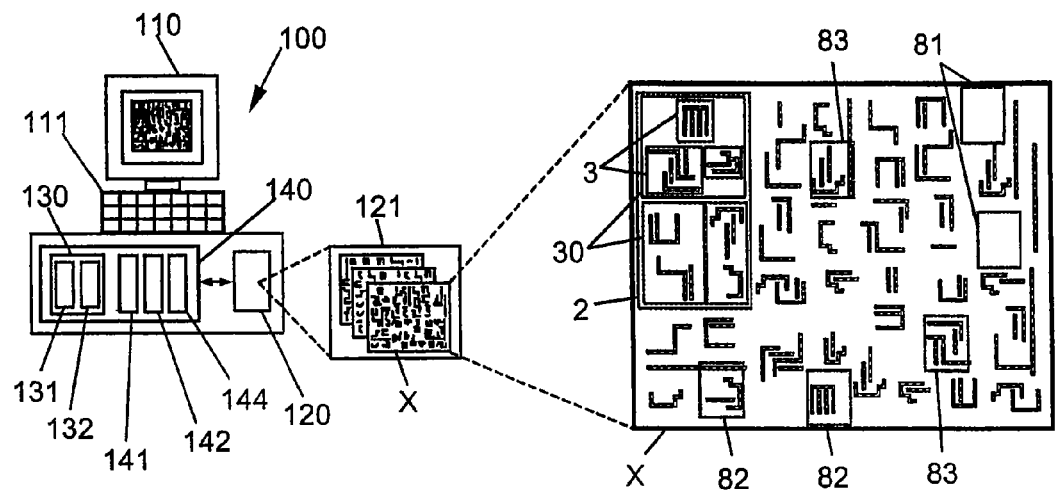
FIGS. 3a and 3b represent a diagram of the physical design of a layer of an integrated circuit, as stored in storage means of an integrated circuit design system, respectively before and after the insertion of dummy surfaces.
Figure 3B:
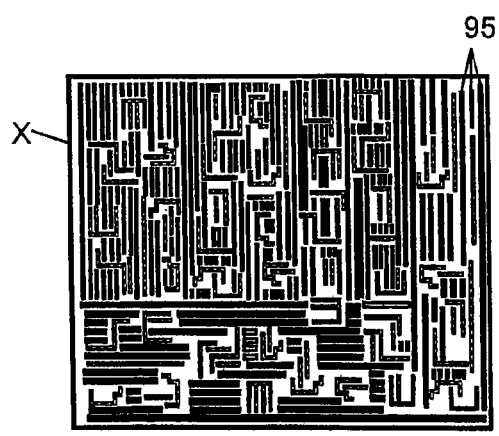

FIGS. 3a and 3b represent the diagram of an exemplary physical design (121) of an integrated circuit, as stored in storage means (120) of an integrated circuit design system (100). The diagram of a layer (X) of the design (121) of the integrated circuit is represented, respectively, before and after the insertion of dummy surfaces (95). Various density control windows (81, 82, 83) are also represented. The method according to the invention performs an implementation of the design (121) in surface density control windows, through the use of processing means (140) of the integrated circuit design system (100) which allow the execution of macros (1) in computer-aided design software tools. The windows (81) in which the surface density is zero will be implemented first. The windows (82) in which the surface density is lower than the minimum required by the manufacturers will be implemented next. The windows (83) in which the surface density is even higher than or equal to the minimum required by the manufacturers does not require the insertion of any surfaces. FIG. 3b shows the result obtained after the insertion of dummy surfaces (95) into this exemplary physical design of a layer (X) of an integrated circuit.

As indicated above, the method according to the invention respects the hierarchy present in the physical design (121) of the integrated circuit. Integrated circuits are essentially organized based on a hierarchy that defines interconnected units (2) containing blocks (30), also interconnected. Each block (30) is generally designed using a particular method such as, for example, the standard cell method or the custom cell method. Each of the known methods results in very different designs, the automatic recognition of which is relatively easy. The physical designs generated are often in the form of several files, which correspond to the design of a block and its specific internal routing, or to the design of a unit and its internal routing between the blocks, with links that call the files related to the blocks contained in the unit, or to the design of the entire circuit with its routing between the units and links that call the files related to the units. The "standard cell" method consists of assembling and interconnecting cells (3) from a library of predefined cells, in which each cell corresponds to a logic gate. The cells are placed in rows and the interconnections are generally produced in channels located between the rows. The "custom cell" method consists of designing cells (3) that are specially sized based on the electrical characteristics implemented. The interconnections of cells of this type are produced inside the cell itself. A block (30) of an integrated circuit often corresponds to a functional system capable of performing a complex logical function. It is therefore advantageous to be able to save, in storage means (120) of an integrated circuit design system (100), blocks (30) which have been specifically developed to perform a given task, and into which dummy surfaces (95) have been inserted, thereby optimizing the performance of the blocks (30). The method according to the invention has the advantage of making this save possible, due to the fact that each of the constituent elements of the integrated circuit are implemented individually. They can therefore be reused independently from one another, with their optimized dummy surfaces (95), in the design of different integrated circuits. Likewise, in the case where a circuit includes a given block (30) or unit (2) that is repeated several times in different regions, the method makes it possible to implement this element only once, and to reuse the implementation for all the repetitions of this element. The modification of one of these elements of the circuit is also facilitated, since it only requires the insertion of new dummy surfaces (95) into the modified element. Moreover, since the method according to the invention makes it possible to implement only certain elements of the circuit, it allows several users to perform the implementation of different regions of the circuit in parallel, so as to accelerate the dummy surface insertion procedure for the entire integrated circuit.

The method according to the invention consists in an automated implementation of the design (121) of an integrated circuit stored in the storage means (120) of the integrated circuit design system. The implementation performed on each of the blocks (30) is different depending on the method that was used for their design, due to different rules for the insertion of dummy surfaces (95), as indicated in FIG. 1. The method is selective as to the design method, and each of the blocks (30) of cells (30) is implemented individually, either through the intervention of the designer who defines the blocks and/or units to be implemented, or through means (141) for recognizing the hierarchy present in the design (121) of the integrated circuits. Dummy surfaces (95) are inserted into the design of the blocks (30) of "standard" cells (3) and the blocks (30) of "custom" cells (3) in order to obtain patterns (4) of dummy surfaces (95) for "standard" blocks and patterns (5) of dummy surfaces (95) for "custom" blocks. The implementation of the routing areas between the cells (3) inside the blocks (30) is performed during the implementation of the blocks (30). The implementation of the routing (31) between the blocks (30) is performed separately. The insertions of dummy surfaces (95) into these blocks (30) and into the interconnection routing (31) of the blocks is done by calculating the surface density in a plurality of successive surface density control windows (81, 82, 83), covering the entire surface of the layer being implemented in the design (121) of the circuit. The size and shape of the surface density control windows in which the density is calculated are defined based on the surface density control windows used by the semiconductor manufacturers, stored in the storage means (120) of the design system (100). The density calculating means (131) of the design system (100) make it possible to determine the windows in which the surface density requires the insertion of dummy surfaces (95). Blocks (30) developed through the standard cell method often require the insertion of dummy surfaces (95) that are smaller, more numerous and closer to one another than those to be inserted into custom blocks. The routing (31) of the metal links between blocks is implemented selectively, in order to obtain patterns (6) for routing dummy surfaces (95). The patterns (6) of routing (31) dummy surfaces (95) are generally similar to the metal links of the routing, but with a large exclusion area, in order to limit the risk of coupling between the dummy surfaces (95) and the metal links of the routing. The combination (60) of the patterns (4, 5) obtained for the blocks (30) of each type of cell (3) with the patterns (6) for the routing (31) results in a homogeneous unit (20) which corresponds to the design of a unit (2) of the circuit with its dummy surfaces (95) integrated. An additional step (not represented) for removing dummy surfaces (95) located on the edge of a given unit (2) that do not respect the exclusion areas is then necessary. Means (144) for verifying the exclusion areas of the dummy surfaces enable this step for going over the design in order to check the spacing between the surfaces and the constituent elements of the circuit and enable the elimination of the dummy surfaces that do not respect these exclusion areas. These means (144) for verifying the exclusion areas implement, for example, a step for re-sizing the elements of the physical design, which are temporarily set at the size of the exclusion areas in order to check for the superposition of dummy surfaces with these re-sized elements by means of a Boolean operation. Whenever a dummy surface is superposed with a re-sized element, it is automatically eliminated because it is located in an exclusion area.

The homogeneous units (20) resulting from the combinations (60) obtained for each of the units (2) of the circuit are then combined with one another. After this combination (21) of the homogeneous units (20), the insertion of dummy surfaces (95) into the routing (22) between the units (2) is necessary in order to complete the implementation of the circuit. Depending on the size and complexity of the integrated circuit, the insertion of the dummy surfaces (95) into the routing between the units (2) of the circuit can be performed in two different ways. When the complexity and size of the circuit are substantial, it is advantageous to perform the insertion of routing dummy surfaces (95) without considering the units (2) in the implementation, in order to reduce the implementation time. Thanks to a step for masking areas defined by the users via the command entry means (111), the homogeneous units (20) are masked so that only the metal links of the routing between the units (2) of the circuit will be implemented. When the complexity and size of the circuit allow it, the method can directly implement the result of the combination (21) of the homogeneous units (20) so as to insert dummy surfaces (95) into them via the application of successive density windows, as in the implementation of the blocks, thereby defining different patterns of dummy surfaces (95) to be inserted. This capability is not represented in FIG. 1 for purposes of clarity. The pattern (22) thus obtained for the dummy surfaces (95) of the routing between the units is added to the result of the combination (21) of the implementation of the homogeneous units (20), via a combination step (23), represented in FIG. 1, in order to obtain a global pattern (200) for the dummy surfaces (95) of the integrated circuit as a whole.

Thanks to the separation of the implementation of the various elements of the circuit, each block (30) of cells (3) or each unit (2) can be reused with its optimized dummy surfaces (95) in a different integrated circuit or in a different region of the same circuit, while integrating its specific internal routing. Likewise, a modification of one of the elements of the circuit requires only the implementation of the dummy surfaces (95) of this element, since these dummy surfaces (95) have been established independently from the other elements of the circuit. The respect for the hierarchy of the design (121) and the separation of the various steps allow each block or unit to be implemented right after it is produced, and they can then be subjected to all the design rule tests, formal proofs, timing studies, etc., while taking into account the existence of the dummy surfaces (95). This separation of the specific steps of each element of the circuit also makes it possible to reduce the necessary implementation time.

Figure 2:
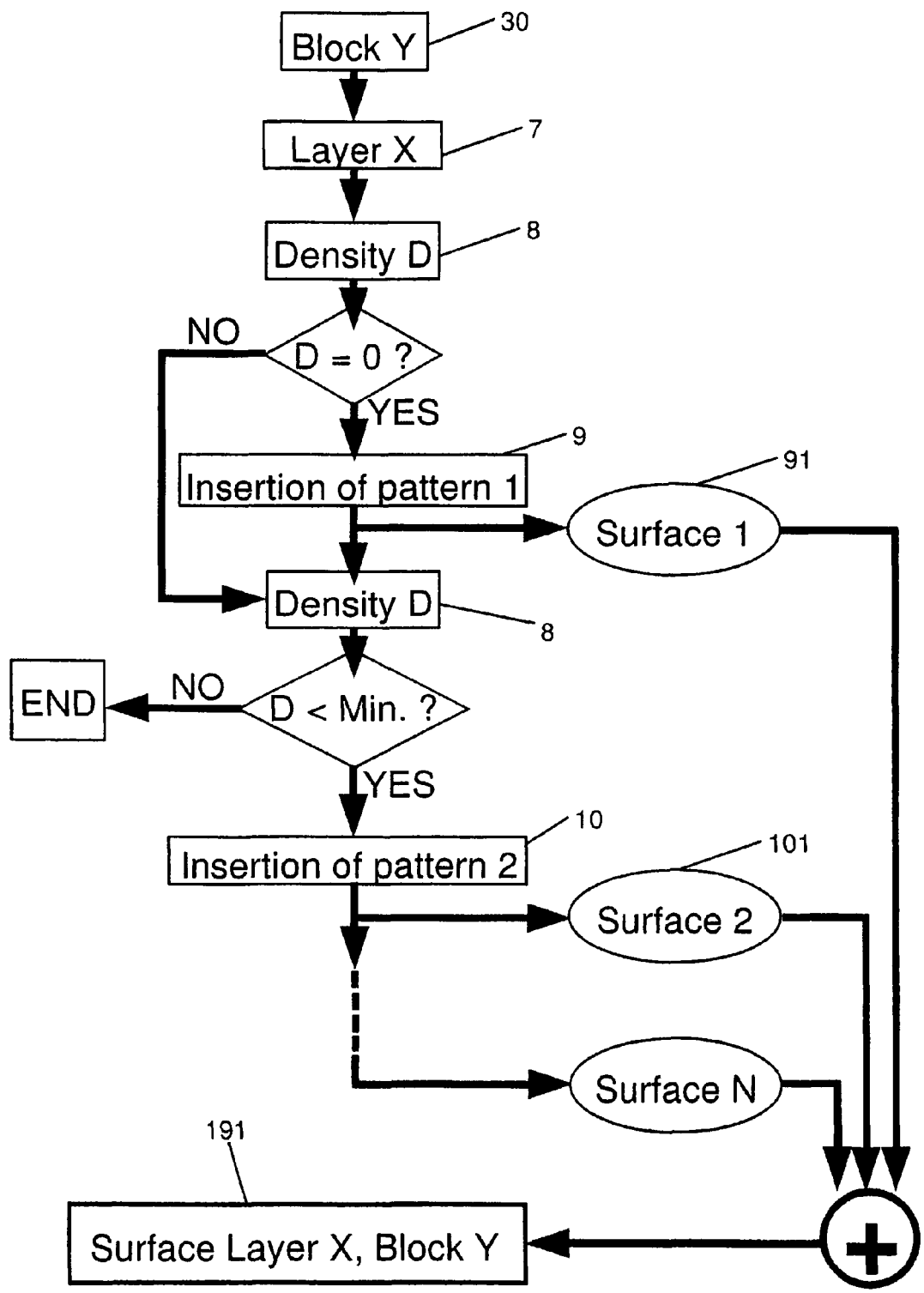
FIG. 2 represents a diagram of the running of the algorithm for inserting dummy surfaces based on density windows.

As shown in FIG. 2, whatever method is used for the design of the blocks (30) of the circuit, the method according to the invention performs the implementation (7) of each of the layers of the integrated circuit by checking (8) the surface density in the design against the minimum density threshold required by the semiconductor manufacturers. Based on the size and shape of the density control windows defined by the semiconductor manufacturers, the method performs the calculation (8) of the density D in a plurality of windows applied successively to the surface of a given layer X of the circuit, using the density calculating means (131) of the design system (100). Depending on the density D calculated for a given window and the method used to design the block (30) of cells (3) corresponding to the density window being implemented, different patterns of dummy surfaces (95) will be inserted. These patterns are determined by means of geometric computing means (132) activated, for example, by the macros (1) executed by the CAD tools, and they represent the shape and the two-dimensional arrangement of the dummy surfaces (95) to be inserted. The density control windows make it possible to implement only the windows whose densities do not correspond to the density required by the manufacturers, in order to minimize the number of elements added.

The method according to the invention complies with a hierarchy for the insertion of dummy surfaces (95), in accordance with the method used for the design of the blocks (30) constituting the various elements of the circuit. The method makes it possible to determine the regions of the design to be implemented first, based on the calculation (8) of the density D performed via the density calculating means (131) of the design system (100). The windows implemented first are those whose surface density is zero, and the pattern inserted is determined through the use of rules for defining the patterns of dummy surfaces (95) stored in the storage means (120) of the design system (100). The implementation of the windows whose density is zero is performed by inserting (9) a first pattern (91) of a dummy surface (95) with the same orientation as the routing of the layer X being implemented. For example, the method will insert rectangles with a length corresponding to the dimensions of the density control window and a width corresponding to the minimum dimension defined by the manufacturers. The spacing between the rectangles will be defined so as to obtain, in the window in which the dummy surface (95) of this pattern (91) is inserted, a density slightly higher than the minimum required by the manufacturers. After the implementation of the windows (81) whose density D was zero, the method performs the implementation of the windows (82) for which the calculation (8) of the density revealed a density lower than the minimum (Min.) required by the manufacturers. This implementation is performed by inserting (10) a second pattern (101) of a dummy surface (95), similar to the metal links of the routing. In order to limit the risk of capacitive coupling and thereby improve the performance of the circuit, the dummy surfaces (95) with this pattern (101) have large exclusion areas, and the superposition of these dummy surfaces with metal links running in the same orientation in another layer is prohibited. However, the two-dimensional arrangement of the cells (3) of the integrated circuit can sometimes pose problems when it comes to full compliance with the various constraints imposed by the manufacturers. In order to overcome these potential problems, the method implements a priority order in the choice of constraints to be imposed from among these constraints on the shape, size, orientation, and exclusion areas that define the patterns of the dummy surfaces (95) to be inserted. During the implementation of the windows whose density D is lower than the required minimum, the priority order makes it possible to modify the patterns of the dummy surfaces (95) using geometric computing means (132) and, if necessary, to lift the constraints, one by one, in the following priority order. The priority order will first authorize the superposition of the dummy surfaces (95) with metal links running in the same orientation in another layer. Next, if necessary, the priority order will authorize the insertion of dummy surfaces (95) with an orientation perpendicular to the orientation of the layer into which they are inserted. If still necessary, the priority order will authorize the reduction of the exclusion areas of the dummy surfaces (95) inserted in the same orientation as the layer. Finally, if still necessary, the priority order will authorize the reduction of the exclusion areas of the dummy surfaces (95) inserted in an orientation perpendicular to that of the layer into which they are inserted. The exclusion areas used during the implementation of the method are initially designed to be larger than the exclusion areas imposed by the manufacturers, so that when the physical design makes it necessary to reduce the size of certain exclusion areas, they will always end up larger than or equal to the exclusion areas defined by the manufacturers. Respecting this priority order in the lifting of constraints on the shape, size, orientation, and exclusion areas of the dummy surfaces (95) to be inserted makes it possible to minimize the coupling capacity between the added dummy surfaces (95) and the elements of the physical design (121) and to obtain an integrated circuit whose performance is optimized. The processing means (140) of the design system (100) use this priority order stored in the storage means (120) of the design system (100) to control the selective determination of the patterns of the dummy surfaces established using the geometric computing means (132).

Furthermore, the hierarchy for the insertion of dummy surfaces is selective as to the method used for the design of the blocks (30) of the circuit. The rules for defining the patterns of the dummy surfaces (95) define the priority order in the choice of constraints on the patterns of the dummy surfaces. For example, for the regions designed using the standard cell method, these rules make it possible to define dummy surfaces (95) of small size that are closer to one another and have limited exclusion areas. The dummy services (95) to be inserted being small, the insertion hierarchy authorizes, based on the priority order, the superposition of the dummy surfaces (95) with metal links running in the same orientation in another layer. In the exemplary implementation of the regions designed using the custom cell method, the two-dimensional arrangement of the cells (3) of a given layer and their routing requires full compliance with the priority order mentioned above. The priority order, among the constraints on the shape, size, orientation and exclusion areas of the dummy surfaces (95) to be inserted, must be strictly observed, while inserting a wide variety of patterns of dummy surfaces (95) adapted to the available space. A large number of iterations of the steps that define this priority order will therefore be necessary in order to obtain an optimized filling of the blocks of the circuit designed using the "custom" cell method.

In operation, the algorithm for inserting dummy surfaces (95) according to the invention consists in the steps listed below and represented in FIG. 2. For a given block Y (30), the algorithm successively performs the implementation (7) of all the layers in which the block Y is written. In a given layer X, the density control windows are successively applied so as to cover the entire surface of the layer X contained in the block Y. The calculation (8) of the surface density D in these windows makes it possible to determine the regions of the layer into which the dummy surfaces (95) should be inserted. The algorithm according to the invention will begin by preferentially implementing all of the windows (81) in which the density is zero, so as to insert (9) patterns (91) of dummy surfaces (95) into them, thus allowing the obtainment of a surface density slightly higher than the minimum required by the semiconductor manufacturers. If no zero-density window is found, the algorithm will implement the windows (82) in which the density is lower than the minimum required by the manufacturers. Patterns (101) of dummy surfaces (95) similar to the metal routing links, but with larger exclusion areas, will be inserted (10) into these windows, so as to obtain a density D higher than the minimum required by the manufacturers. Once all of the N density control windows have been implemented, the algorithm performs a combination of the various patterns (91, 101) developed for the N density windows, so as to obtain a pattern (191) for the dummy surfaces (95) of the entire part of the layer X contained in the block Y, then move on to the implementation of the next layer. If no window of insufficient density is found in the layer X, the algorithm ends the implementation of this layer and proceeds to the implementation of the next layer.

The hierarchical organization of the method according to the invention makes it possible to respect the hierarchy of the physical design (121) of the integrated circuits. The insertion hierarchy and the priority order of the constraints make it possible to specifically and selectively implement the various regions of the design so as to optimize the performance of the integrated circuit. This method also makes it possible to implement non-hierarchical physical designs (121), thanks to the insertion hierarchy of the dummy surfaces, which defines the windows to be implemented first based on their density. Selectivity is provided by the step for masking areas defined by the designer. The capability to define different patterns for dummy surfaces (95) to be inserted in the windows through the use of the macros (1) makes it possible to define a set of patterns for each differentiated region.

In one embodiment of the invention, the method is implemented by a computer-aided design software tool that incorporates the various means described above. In another embodiment of the invention, the method is implemented by macros (1) executed in the software environment provided by conventional CAD tools. These macros (1) make it possible to implement the various steps of the method performed using the various means described above.

It should be clear to those skilled in the art that the present invention allows for embodiments in many other specific forms without taking it outside the range of application of the invention as claimed. Consequently, the present embodiments should be considered illustrative, but could be modified within the range defined by the scope of the attached claims, and the invention should not be limited to the details given above.

The invention claimed is:

1. An integrated circuit design system configured to insert dummy surfaces into various layers of a physical design of a multilayer integrated circuit organized in interconnected units containing interconnected blocks composed of interconnected cells through execution of macros in computer-aided design software tools comprising display means and means for command entry by a user, comprising:
   storage means for storing information related to the physical design of the multilayer integrated circuit;
   calculating means for determining a design of the interconnected blocks and/or integrated circuits, area verification means for recognizing exclusion areas; and
   processing means for performing selective insertion of the dummy surfaces based on an insertion hierarchy that reflects a hierarchy of the physical design of the integrated circuit using an individual implementation of the interconnected blocks and a first interconnection routing for said interconnected blocks, and using an individual implementation of the interconnected units and a second interconnection routing for said interconnected units,
   wherein the patterns of the dummy surfaces are established selectively in accordance with the design of the blocks of the multilayer integrated circuit and based on at least one or more designs of standards cells and custom cells.

2. The integrated circuit design system according to claim 1, wherein the calculating means further comprises density calculating means and geometric computing means configured to cooperatively determine at least the design of the interconnected blocks and/or the multilayer integrated circuit.

3. The integrated circuit design system according to Claim 2, wherein the storage means also contains information concerning the physical design of the integrated circuit into which the dummy surfaces are to be inserted, shape and dimensions of density control windows defined by at least one semiconductor manufacturer, rules for defining patterns for the dummy surfaces based on surface densities of one or more of the density control windows, various methods for designing the blocks constituting the integrated circuit, and a priority order defined by the manufacturer of the integrated circuit for a choice of constraints to be imposed on the patterns of the dummy surfaces to be inserted, all of this information being accessible to the processing means of the integrated circuit design system so that it can be taken into account during execution of the macros that allow the definition of the patterns of the dummy surfaces and their insertion into successive layers of the multilayer integrated circuit.

4. The integrated circuit design system according to claim 3, further comprising means for recognizing the hierarchy of the design and means for recognizing the design methods, so that the definition of the blocks and/or units to be implemented in the design of the circuit, and of the method used for their design, is implemented in an automated way by the system without requiring the intervention of the user.

5. The integrated circuit design system according to claim 2, further comprising means for recognizing the hierarchy of the design and means for recognizing the design methods, so that the definition of the blocks and/or units to be implemented in the design of the circuit, and of the method used for their design, is implemented in an automated way by the system without requiring the intervention of the user.

6. The integrated circuit design system according to claim 1, wherein the storage means also contains information concerning the physical design of the multilayer integrated circuit into which the dummy surfaces are to be inserted, shape and dimensions of density control windows defined by at least one semiconductor manufacturer, rules for defining patterns for the dummy surfaces which make it possible to define patterns for the dummy surfaces based on surface densities of the density control windows, various methods for designing blocks constituting the integrated circuit, and a priority order defined by the at least one manufacturer of the integrated circuit for a choice of constraints to be imposed on the patterns of the dummy surfaces to be inserted, all of this information being accessible to the processing means of the integrated circuit design system so that it can be taken into account during execution of the macros that allow the definition of the patterns of the dummy surfaces and their insertion into successive layers of the multilayer integrated circuit.

7. The integrated circuit design system according to claim 6, further comprising means for recognizing the hierarchy of the design and means for recognizing the design methods, so that the definition of the blocks and/or units to be implemented in the design of the circuit, and of the method used for their design, is implemented in an automated way by the system without requiring the intervention of the user.

8. The integrated circuit design system according to claim 1, further comprising means for recognizing the hierarchy of the design and means for recognizing the design methods, so that definition of the blocks and/or units to be implemented in the design of the circuit, and of the method used for their design, is implemented in an automated way by the system without requiring the intervention of the user.

* * * * *